(12) United States Patent
Udagawa

(10) Patent No.: US 6,541,799 B2
(45) Date of Patent: Apr. 1, 2003

(54) GROUP-III NITRIDE SEMICONDUCTOR LIGHT-EMITTING DIODE

(75) Inventor: Takashi Udagawa, Saitama (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/076,425

(22) Filed: Feb. 19, 2002

(65) Prior Publication Data

US 2002/0113235 A1 Aug. 22, 2002

Related U.S. Application Data

(60) Provisional application No. 60/276,206, filed on Mar. 16, 2001.

(30) Foreign Application Priority Data

Feb. 20, 2001 (JP) ........................................ 2001-043142

(51) Int. Cl.[7] ...................... H01L 33/00; H01L 31/0328; H01L 21/00
(52) U.S. Cl. ............................ 257/94; 257/96; 257/190; 257/191; 257/200; 257/201; 438/22; 438/46; 438/47; 438/604
(58) Field of Search .............................. 257/94, 95, 87, 257/103, 96, 97, 98, 86; 357/17, 60, 68

(56) References Cited

U.S. PATENT DOCUMENTS

| 4,990,972 A | * | 2/1991 | Satoh et al. ................. 257/627 |
| 5,874,747 A | * | 2/1999 | Redwing et al. ............. 257/103 |
| 6,150,672 A | * | 11/2000 | Kaneko ........................ 257/22 |

FOREIGN PATENT DOCUMENTS

| JP | 2-275682 | 11/1990 | |
| JP | 2-288371 | 11/1990 | |
| JP | 2-288388 | 11/1990 | |
| JP | 4-209584 | * 7/1992 | ........... H01L/21/20 |
| JP | 10-242586 | 9/1998 | |
| JP | 2000-261033 | 9/2000 | |
| JP | 2000-286449 | 10/2000 | |

OTHER PUBLICATIONS

Guha, Supratik et al.; Ultraviolet and violet GaN light emitting diodes on Silicon—Jan. 26, 1998; Appl. Phys. Lett.; vol. 72; pp. 415–417.*

Supratik Guha and Nestor A. Bojarczuk, "Ultraviolet and violet GaN light emitting diodes on silicon", Appl. Phys. Lett., Jan. 26, 1998, 72 (4) pp. 415–417, IBM T.J. Watson Research Center, Yorktown Heights, New York 10598.

S.Guha and N.A. Bojarczuk, "GaN based light emitting diodes grown on Si (111) by molecular beam epitaxy", Electronics Letters, 6th Nov., 1997, vol. 33, No. 23, pp. 1986–1987.

* cited by examiner

Primary Examiner—Carl Whitehead, Jr.
Assistant Examiner—David L. Hogans
(74) Attorney, Agent, or Firm—Sughrue Mion, PLLC

(57) ABSTRACT

A Group-III nitride semiconductor light-emitting diode having an electrically conducting silicon (Si) single crystal substrate having on an upper surface thereof at least a light-emitting part having a pn-heterojunction structure composed of a Group-III nitride semiconductor, which light-emitting part is stacked via an intermediate layer composed of a metal or a semiconductor, the single crystal substrate having a back surface electrode on a back surface thereof, a surface electrode on an upper surface of the light-emitting part and a perforated part formed by eliminating the Si single crystal substrate in a region exclusive of the back surface electrode on the back surface of the single crystal substrate and a method of manufacturing thereof are disclosed.

10 Claims, 4 Drawing Sheets

US 6,541,799 B2

GROUP-III NITRIDE SEMICONDUCTOR LIGHT-EMITTING DIODE

CROSS REFERENCE TO RELATED APPLICATIONS

This application is an application filed under 35 U.S.C. §111(a) claiming benefit pursuant to 35 U.S.C. §119(e)(1) of the filing date of Provisional Application No. 60/276,206 filed Mar. 16, 2001 pursuant to 35 U.S.C. §111(b).

FIELD OF THE INVENTION

The present invention relates to a Group-III nitride semiconductor light-emitting diode (LED) comprising an Si single crystal as a substrate. More specifically, the present invention relates to a high emission-intensity pn-heterojunction structure type Group-III nitride semiconductor light-emitting LED reduced in the absorption of emission attributable to a single crystal substrate, and also relates to a production method thereof.

BACKGROUND OF THE INVENTION

A silicon (Si) single crystal is conventionally known as a representative semiconductor substrate material having an electric conductivity advantageous for the input/output of a device driving power source and exhibiting cleavability useful for cutting into individual elements. Recently, techniques for fabricating a Group-III nitride semiconductor light-emitting diode (LED) using a silicon single crystal (silicon) as a substrate have been disclosed (see, *Electron. Lett.*, 33(23), pp. 1986–1987 (1997)).

In the Group-III nitride semiconductor nitride light-emitting diode, a light-emitting part having a pn-double heterojunction structure composed of aluminum gallium nitride ($Al_aGa_{1-a}N$, wherein $0 \leq a \leq 1$) and gallium indium nitride ($Ga_aIn_{1-a}N$, wherein $0 \leq a \leq 1$) is provided (see, *Appl. Phys. Lett.*, 72(4), pp. 415–417 (1998)).

The Si single crystal as a substrate has a lattice mismatch relationship with the Group-III nitride semiconductor constituting the light-emitting part. A large number of conventional techniques have been proposed to provide an intermediate layer between the single crystal substrate and the light-emitting part of LED to act as a buffer for the mismatch.

For example, a proposal has been made to provide an intermediate layer composed of aluminum nitride (AlN) for relieving the lattice mismatching and thereby obtaining a good quality light-emitting layer (see, *Appl. Phys.*, supra, and JP-A-10-242586 (the term "JP-A" as used herein means an "unexamined published Japanese patent application")).

Also, a technique of providing boron phosphide (BP) as a buffer layer on a zinc-blend type single crystal substrate such as gallium phosphide (GaP) and silicon is known (see, JP-A-2-275682, JP-A-2-288371 and JP-A-2-288388).

Furthermore, a technique of providing a metal film such as titanium (Ti) as an intermediate layer on an Si single crystal substrate is also proposed (see, JP-A-2000-261033).

In addition, a technique of disposing a titanium nitride (TiN) layer or a nitride layer of cobalt (Co) or the like as an intermediate layer on an Si single crystal substrate having a crystal plane of {111} is also disclosed (see, JP-A-2000-286449).

On the other hand, the band gap of Si single crystal is about 1.1 electron volts (unit: eV) (see, Iwao Teramoto, *Handotai Device Gairon (Introduction of Semiconductor Device)*, page 28, Baihukan (May, 30, 1995)). This band gap is as small as half or less as compared, for example, with the transition energy corresponding to light emission in the blue band. Because of this, in the LED fabricated using an Si single crystal as the substrate, the light emission at the short wavelength region radiated from the light-emitting part of a Group-III nitride semiconductor is disadvantageously absorbed by the Si crystal substrate. In other words, absorption of emitted light by Si single crystal substrate cannot be avoided when the Group-III nitride semiconductor LED uses a Si as a substrate material and therefore, a high brightness Group-III nitride semiconductor LED can be hardly obtained.

For increasing the emission intensity of a Group-III nitride semiconductor LED using a Si substrate, a technique of providing a Bragg reflection (DBR) structure layer for reflecting the emitted light toward the outside, between the Si substrate and the light-emitting part has been disclosed (see, *Mat. Res. Soc. Symp. Proc.*, Vol. 449 (1997), pp. 79–84). The DBR layer in conventional examples is composed of a periodic laminate structure where $Al_aGa_{1-a}N$ ($0 \leq a \leq 1$) thin layers different in the aluminum composition ratio (=a) are repeatedly superposed on one another. The reflectance of emitted light from the DBR layer can be improved by increasing the lamination period unit but the lamination operation becomes disadvantageously more cumbersome.

Although a large number of proposals have been heretofore made to eliminate the substrate of LED and thereby increase the light emission intensity, mere removal of the substrate part from LED inevitably impairs the mechanical strength of LED. Therefore, a reasonable countermeasure is demanded. Under these circumstances, development of a method for obtaining a high emission intensity Group-III nitride semiconductor light-emitting LED having a sufficiently high mechanical strength by simpler and easier technical means has been demanded.

SUMMARY OF THE INVENTION

An object of the present invention is to develop a Group-III nitride semiconductor LED using an Si single crystal substrate, which is a high brightness Group-III nitride semiconductor LED obtained by technical means of eliminating the Si single crystal substrate from LED without losing the mechanical strength of LED and thereby reducing the absorption of emitted light attributable to the Si substrate.

More specifically, the present invention has overcome the above-described problems by developing the following embodiments:

[1] a Group-III nitride semiconductor light-emitting diode comprising an electrically conducting silicon (Si) single crystal substrate having on an upper surface thereof at least a light-emitting part having a pn-heterojunction structure composed of a Group-III nitride semiconductor, which light-emitting part is stacked via an intermediate layer composed of a metal or a semiconductor, the single crystal substrate having a back surface electrode on a back surface thereof, a surface electrode on an upper surface of the light-emitting part and a perforated part formed by eliminating the Si single crystal substrate in a region exclusive of the back surface electrode on the back surface of the single crystal substrate;

[2] the Group-III nitride semiconductor light-emitting diode as described in [1] above, wherein the back surface electrode on the silicon single crystal substrate comprises a continuous metal coating electrode;

[3] the Group-III nitride semiconductor light-emitting diode as described in [1] or [2] above, wherein the back surface electrode on the silicon single crystal substrate comprises a continuous metal coating electrode in an outer circumference of the perforated part;

[4] the Group-III nitride semiconductor light-emitting diode as described in [1] or [3] above, wherein the bottom surface of the perforated part is the above-described intermediate layer;

[5] the Group-III nitride semiconductor light-emitting diode as described in [4] above, wherein the intermediate layer comprises a Group III–V compound semiconductor film containing phosphorus (P);

[6] the Group-III nitride silicon semiconductor light-emitting diode as described in [4] or [5] above, wherein the intermediate layer comprises $MN_{1-X}P_X$ wherein M represents a Group-III element other than boron, and X is in the range of $0<X\leq1$;

[7] the Group-III nitride semiconductor light-emitting diode as described in [4] or [5] above, wherein the intermediate layer comprises $B_XM_{1-X}P$ wherein M represents a Group-III element other than boron, and X is in the range of $0<X\leq1$;

[8] the Group-III nitride semiconductor light-emitting diode as described in [7] above, wherein the intermediate layer has a concentration gradient of a Group-III constituent element or Group-V constituent element;

[9] a method for manufacturing a Group-III nitride semiconductor light-emitting diode, which comprises providing an intermediate layer having a low-temperature buffer layer and a high-temperature buffer layer on an electrically conducting Si single crystal substrate, providing a light-emitting part having a pn-heterojunction structure and including a lower clad layer, a light-emitting layer and an upper clad layer on the intermediate layer, perforating a back surface of the Si single crystal substrate into a hollow cylindrical form to obtain a perforated part and providing a first conduction-type electrode on the remaining back surface of the Si single crystal substrate and a second conduction-type electrode on the upper surface of the upper clad layer;

[10] the method for manufacturing a Group-III nitride semiconductor light-emitting diode as described in [9] above, which comprises growing the low-temperature layer at 250 to 550° C. by MOCVD and the high-temperature layer at 750 to 1,200° C. by MOCVD;

[11] a method for manufacturing a Group-III nitride semiconductor light-emitting diode, which comprises providing an intermediate layer consisting of a compositional gradient buffer layer on an electrically conducting silicon single crystal substrate, providing a light-emitting part having a pn-heterojunction structure and including a lower clad layer, a light-emitting layer and an upper clad layer on the intermediate layer, perforating the back surface of the Si single crystal substrate into a hollow cylindrical form to provide a perforated part before or after providing the light-emitting part, and providing a first conduction-type electrode on the remaining back surface of the Si single crystal substrate and a second conduction-type electrode on the upper surface of the upper clad layer;

[12] the method for manufacturing a Group-III nitride semiconductor light-emitting diode as described in any one of [9] to [11] above, wherein the crystal plane of the electrical conducting Si single crystal substrate is {111}; and

[13] the method for manufacturing a Group-III nitride semiconductor light-emitting diode as described in any one of [9] or [12] above, which further comprises grinding the back surface of the silicon single crystal substrate is ground to reduce the thickness of the substrate to 300 to 80 μm and eliminating the single crystal substrate in the part excluding the region where an ohmic electrode is laid is eliminated to provide the perforated part after providing the intermediate layer on the surface of the silicon single crystal substrate.

DETAILED DESCRIPTION OF THE PREFERRED EMBODIMENTS

The Group-III nitride semiconductor light-emitting diode (LED) of the present invention is fabricated using an electrically conducting Si single crystal substrate having a crystal plane of {100}, {111}, {110} or the like. The substrate may be either an n-type Si single crystal or a p-type Si single crystal insofar as it has a resistivity of $10^3$ Ω□ cm, preferably $10^1$ Ω□ cm. Since LED must be simply and easily fabricated by laying an ohmic electrode on the back surface using the electric conductivity of the Si substrate, an undoped Si single crystal having high resistance cannot be suitably used as a substrate.

On the {111} crystal plane, Si atoms are densely present compared with other crystal planes such as {100} and therefore, when an Si single crystal having a crystal plane of {111} is used as a substrate, the elements constituting the intermediate layer can be more successfully prevented from diffusing and invading into the Si single crystal substrate, which is advantageous for attaining an intermediate layer in good balance also from the stoichiometric aspect.

The Si single crystal in the region where an ohmic electrode (a back surface electrode=first electrode) is laid on the back surface of the Si single crystal substrate is allowed to remain, and the Si single crystal material in the other regions is removed using a known etching technique. When the substrate material in the region where the back surface electrode (first electrode) is present is allowed to remain, an effect of more firmly supporting the LED is attained using the mechanical strength of the remaining substrate material, as compared with the case of removing the entire substrate. Furthermore, by leaving the electrically conducting substrate material, a back surface electrode (first electrode) having a low contact resistance and excellent ohmic property is provided.

The removal may be performed, for example, by plasma etching using a chlorine (Cl) type gas or by wet etching using a mixed solution of hydrofluoric acid (HF) and nitric acid ($HNO_3$).

That is, the Si single crystal in the region excluding the area where the back surface electrode is stacked can be removed through selective patterning using known photolithography. The region excluding the area where the back surface electrode is present, (i.e., where the Si single crystal is removed), is preferably as wide as possible. As the cross section area in the region from which the Si single crystal is removed is larger, the light emitted from the light-emitting part is less absorbed by the Si substrate material and therefore, the area capable of transmitting light toward the outside is increased, which contributes to the enhancement of light intensity.

Figure 1:
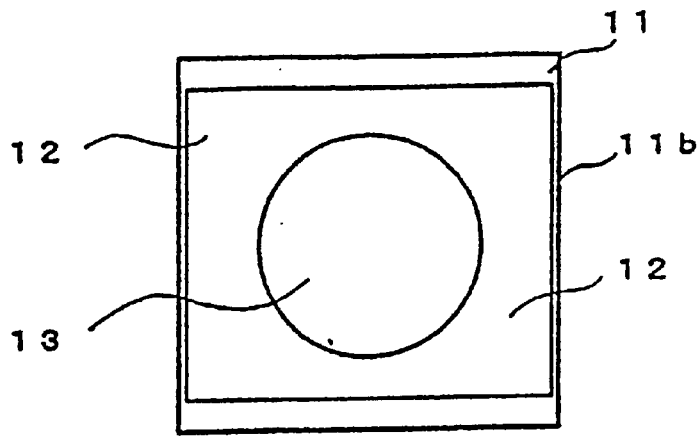
FIG. 1 is a schematic plan view showing an example of a perforation shape in a perforated part.
Figure 2:
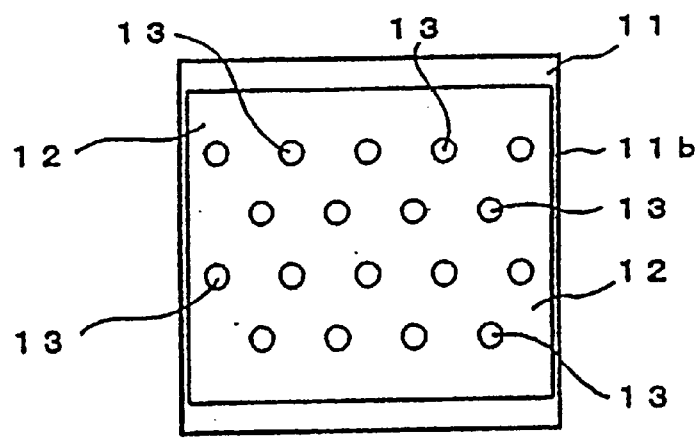
FIG. 2 is a schematic plan view showing another example of a perforation shape in a perforated part.

From these reasons, the cross section shape of the region for applying the selective patterning can be freely selected within the range of ensuring easy etching perforation, sufficiently large cross section area and mechanical strength of Group-III nitride semiconductor LED. For example, as shown in FIG. 1, the back surface 11b side of the LED substrate 11 may have a construction such that only one circular perforated part 13 is provided in the back surface region of an Si single crystal 11 excluding the back surface electrode 12. It is also possible to provide a plurality of circular perforated parts. FIG. 2 shows an example where a plurality of circular perforated parts 13 are provided on the back surface 11b of an Si single crystal substrate 11. The perforated part 13 shown in FIGS. 1 and 2 has a circular horizontal cross section, however, the cross section may have any circular shape such as elliptic shape or fan shape that is a part of a circle if the selective patterning and the etching can be simply and easily performed.

In any shape, the light emission intensity is affected by the total cross section area of the perforated part rather than the cross section shape of the perforated area and the light emission intensity increases in proportion to the cross section area of the perforated part. Accordingly, it is important that the cross section area in the portion where the Si single crystal is removed is made as broad as possible but not to the extent that extreme reduction in the mechanical supporting power of the light-emitting part due to the removal of substrate is caused.

The perforated part can also be provided to have a rectangular cross section shape such as square, rectangle, rhombus or parallelogram. In any case, similarly to the circular perforated part in the above-described practical embodiment, the cross section shape of the perforated part can be easily obtained by etching.

Figure 3:
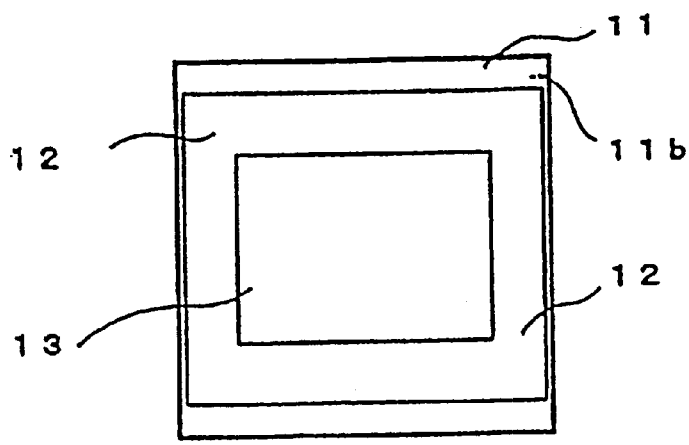
FIG. 3 is a schematic plan view showing a third example of a perforation shape in a perforated part.

FIG. 3 shows an example of the construction where a perforated part 13 having a rectangular belt-like cross section shape is provided on the back surface 11b of a {111}-Si single crystal substrate 11. In providing a perforated part having a rectangular cross section shape, it is also important that the total area of the perforated part is as broad as possible but not to an extent that extreme reduction in the mechanical supporting power of the light-emitting part by the removal of the substrate is incurred. For enlarging the cross section area in the region from which the Si substrate is removed, a plurality of rectangular perforated parts may be provided.

The perforated part may also be provided to have a belt-like shape resulting from connecting several shapes.

Figure 4:
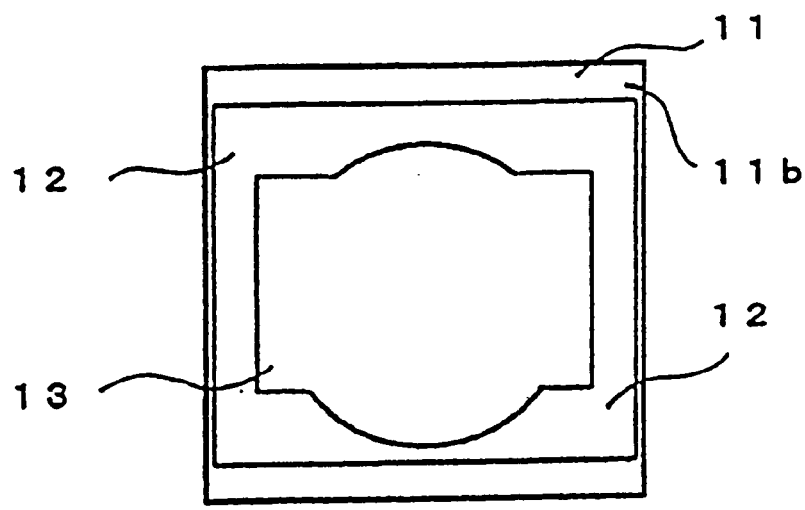
FIG. 4 is a schematic plan view showing a fourth example of a perforation shape in a perforated part.

A circular perforated part and a rectangular perforated part may be connected to form a belt-like perforated part. When a rectangular perforated part and a circular perforated part are combined as shown in FIG. 4, the substrate-removed area can be more enlarged compared with the case of providing a rectangular perforated part and thereby, the area capable of transmitting emitted light can be enlarged.

Whichever horizontal cross section shape the perforated part may have, an ohmic electrode as a substrate back surface electrode is disposed in the circumference thereof. On a p-type Si substrate, a back surface p-type ohmic electrode is formed by depositing a metal film such as gold (Au). In the case of an n-type silicon substrate, the n-type ohmic electrode can be composed of, for example, aluminum (Al) or aluminum-antimony (Al-Sb) alloy. A plurality of back surface electrodes may be provided at positions isolated from each other on the back surface of Si substrate but are preferably provided such that these are electrically connected with each other.

In the Group-III nitride semiconductor LED of the present invention, the bottom surface of the perforated part is the crystal plane of the intermediate layer described above. More specifically, the punching of a perforated part is stopped on reaching the site (the point capable of ensuring necessary strength) constituting the intermediate layer and the constituent layer of the intermediate layer is exposed as a bottom surface of the perforated part. In this case, the depth of the perforated part using the intermediate layer as the bottom face is almost the same as the thickness of the Si single crystal substrate. A structure allowing a constituent layer of the light-emitting part provided on the intermediate layer to serve as the bottom surface of the perforated part may also be employed. However, if the punching is continued to allow a constituent layer of the light-emitting part to serve as a bottom surface, the intermediate layer supporting the mechanical strength of LED is weakened and the thickness of LED as a whole is reduced although the light emission intensity may increase. As a result, the mechanical strength deteriorates to cause a problem in mechanically supporting the light-emitting part. Accordingly, in a structure suitable for mechanically supporting the light-emitting part, the perforated part of the Si single crystal substrate is stopped at the intermediate layer below the light-emitting part and a constituent layer of the intermediate layer is allowed to serve as the bottom surface of the perforated part.

The perforated part using the intermediate layer as the bottom surface may be formed after stacking the intermediate layer on the surface of an Si single crystal substrate and before forming a single- or double-heterojunction light-emitting part on the intermediate layer. However, also in this case, a step of forming the perforated part must be inserted in the lamination process, and therefore, the lamination process becomes discontinuous and redundant. The perforated part may also be formed after the light-emitting part is formed.

As the thickness of the Si single crystal substrate is smaller, the perforated part can be formed more easily. Accordingly, when the punching is performed after a laminate structure (a light-emitting part having a pn-heterojunction structure) is grown and the back surface of the Si single crystal substrate is polished to reduce the thickness, the perforated part can be easily formed.

The thickness of the Si single crystal substrate may be reduced using polishing means such as lapping to reduce the thickness of the entire laminate structure and this is advantageous in that the cutting into individual elements is facilitated.

If the back surface of the Si single crystal substrate is ground in an extremely large amount to decrease the thickness of the substrate, the formation of the perforated part and the cutting into individual elements may be facilitated. However, the thickness is insufficient to support the mechanical strength of LED. The thickness of the Si substrate allowed to remain is suitably on the order of 300 to 80 μm, preferably from 250 to 100 μm.

The intermediate layer may be formed of a nitride of high melting point metal, such as titanium nitride (TiN) and zirconium nitride (ZrN), or an element metal such as aluminum and gold.

However, if the intermediate layer is composed of a metal film because light emitted from the light-emitting part is absorbed in an extremely high degree when an elemental metal is employed, the emitted light is absorbed or shielded by the intermediate layer and the intensity of light emitted outside from the perforated part may disadvantageously decrease to an extreme extent.

The nitride of a high-melting point metal is sometimes colored depending on the stoichiometric equivalent ratio between the nitride and the metal element. Accordingly, when the intermediate layer is composed using a metal nitride material, the intensity of emitted light which can be withdrawn from the perforated part becomes unstable in some cases depending on the degree of coloring. Most elemental metals and metal nitrides fail in having a lattice constant very close to that of general Group-III nitride semiconductors used for forming the light-emitting part of Group-III nitride semiconductor LEDs. Because of this lattice mismatch, an intermediate layer composed of an elemental metal or metal nitride is not always suited for the lamination of a Group-III nitride semiconductor layer constituting the light-emitting part having excellent crystallinity. On the other hand, when the intermediate layer is composed of a semiconductor material, an effect of reducing the emitted light absorption by the intermediate layer, which cannot be avoided in the case of using the above-described metal material can be provided.

Accordingly, from Group III–V compound semiconductors containing phosphorus, a firm intermediate layer having excellent mechanical strength can be formed compared with those formed from Group III–V compound semiconductors containing arsenic (As) as a constituent element. Furthermore, although the melting point of boron arsenide (BAs) is about 1,000° C., the melting point of boron phosphide (BP) is as high as about 3,000° C. (see, Iwao Teramoto, *Handotai Device Gairon* (*Introduction of Semiconductor Device*), page 28, Baihukan (May, 30, 1995)). Therefore, the intermediate layer formed from phosphorus-containing Group III–V compound semiconductors can advantageously exert heat resistance sufficiently high to endure a high-temperature process in excess of about 1,000° C. at the time of depositing a Group-III nitride semiconductor layer as an upper layer.

Examples of the Group III–V compound semiconductor include boron phosphide (BP), gallium nitride phosphide ($GaN_{1-X}P_X$, wherein $0<X\leq1$), aluminum nitride phosphide ($AlN_{1-X}P_X$, wherein $0<X\leq1$), indium nitride phosphide ($InN_{1-X}P_X$, wherein $0<X\leq1$), boron aluminum phosphide ($B_XAl_{1-X}P_X$, wherein $0<X\leq1$), boron gallium phosphide ($B_XGa_{1-X}P$, wherein $0<X\leq1$) and indium boron phosphide ($B_XIn_{1-X}P$, wherein $0<X\leq1$). Generally, the conduction type of the intermediate layer is the same as that of the electrically conducting single crystal substrate.

In the case where a buffer layer is composed of, for example, boron phosphide (BP) having a lattice constant different from the Si single crystal, the buffer layer grown at a relatively low temperature (low-temperature buffer layer) acts to relax the lattice mismatch between the Si single crystal and the constituent layer of a multilayer structure and thereby impart excellent crystallinity to the constituent layer.

For example, a BP low-temperature buffer layer formed at a relatively low temperature of 250 to 500° C. provides an effect of relaxing the lattice mismatch with the Si single crystal as high as about 16.5% (see, Katsufusa Shono, *Handotai Gijutsu* (*Jokan*) (*Semiconductor Technology* (*Upper Edition*)), Tokyo University Shuppan Kai, 9th ed., page 77 (Jun. 25, 1992)) and giving a good constituent layer reduced in the crystal defects such as misfit dislocation, to a multilayer structure (see, U.S. Pat. No. 6,069,021).

When the intermediate is composed of a crystal layer having a gradient in the concentration of Group III or Group V constituent element, the lattice mismatch between the Si single crystal substrate and the upper layer, for example, a Group III nitride semiconductor layer can be advantageously relaxed. For example, from a boron indium phosphide ($B_XIn_{1-X}P$, wherein $0<X\leq1$) layer where the indium (In) composition ratio at the interface of joining with the Si single crystal substrate is 0.67 and the indium composition ratio is decreased toward the surface, an intermediate layer providing an upper layer having excellent crystallinity, for example, a gallium nitride phosphide ($GaN_{1-X}P_X$, wherein $0<X\leq1$) layer, can be constructed. The intermediate layer imparted with a compositional gradient capable of giving a Group III nitride semiconductor layer reduced in crystal defects ascribable to the lattice mismatch, such as dislocation, and having excellent crystallinity can be composed of aluminum nitride phosphide ($AlN_{1-X}P_X$, wherein $0<X\leq1$), indium nitride phosphide ($InN_{1-X}P$, wherein $0<X\leq1$) or the like.

The compositional gradient layer in the intermediate layer of the Group-III nitride semiconductor LED of the present invention is composed of a mixed crystal represented by the composition formula: $MN_{1-X}P_X$ (wherein $0<X\leq1$ and M represents a Group III element), such as gallium nitride phosphide ($GaN_{1-X}P_X$ wherein $0<X\leq1$), where the composition ratio (=X) of phosphorus (P) as a constituent element other than nitrogen (N) is decreased in the direction of increasing layer thickness and in correspondence therewith, the nitrogen composition ratio (=1-X) is increased. The gradient form of the composition may be linear, curved or stepwise (see, JP-A-2000-22211). The intermediate layer having a compositional gradient can be formed by changing the amounts of the phosphorus and nitrogen supply sources added with the passage of time, which are added to the inside of the growth reaction system during film formation of the intermediate layer. The intermediate layer imparted with a gradient in the composition of Group V element has a function of relaxing the lattice mismatch with the Si single crystal substrate and providing a Group-III nitride semiconductor layer having excellent crystallinity.

Also, the intermediate layer can be composed of a phosphorus-containing Group III–V compound semiconductor crystal layer having a gradient in the composition of the Group III constituent element. Particularly, an intermediate layer effective in relaxing the lattice mismatch with the Si single crystal substrate can be composed of a boron phosphide (BP) related mixed crystal containing boron (B) as the Group III constituent element, represented by the composition formula: $B_XM_{1-X}P$ (wherein $0<X\leq1$ and M represents a Group III element), such as boron gallium phosphide ($B_XGa_{1-X}P$, wherein $0<X\leq1$) and boron indium phosphide ($B_XIn_{1-X}P$, wherein $0<X\leq1$). In the case of a Group III–V compound semiconductor composed of a plurality of Group III constituent elements and a sole Group V constituent element, the intermediate is constructed by imparting a gradient to the composition of boron or other Group III constituent element.

Particularly, in the case of using an Si single crystal substrate, a compositional gradient layer where the composition ratio (=X) of boron (B) is increased in the direction of increasing layer thickness and , the composition ratio of other Group III constituent element such as gallium (Ga) or indium (In) is decreased can be suitably used as the intermediate layer.

For example, $B_xGa_{1-x}P$ (where the boron composition ratio (=X) at the junction interface with the Si single crystal substrate is 0.02 and the boron composition ratio on the surface is 1.0) is useful as an intermediate layer capable of lattice matching with both Si single crystal (lattice constant: 5.431 Å) and gallium nitride phosphide ($GaN_{0.97}P_{0.03}$, lattice constant: 4.538 Å).

The intermediate layer having a gradient in the composition of Group III element can be formed by changing the amount of the organic metal compound as a starting material of the Group III constituent element supplied to the reaction system, with the passage of time during formation of the intermediate layer by MOCVD.

In the Group-III nitride semiconductor LED of the present invention, which is a Group-III nitride semiconductor light-emitting diode where a light-emitting part having a pn-heterojunction structure composed of a Group-III nitride semiconductor is stacked on the surface of an electrically conducting silicon (Si) single crystal substrate through an intermediate layer, the single crystal substrate has a back surface electrode on the back surface thereof and a surface electrode on the light-emitting part on the surface side, and at the same time, a perforated part is formed by eliminating the Si single crystal substrate in the region exclusive of the back surface electrode on the back surface of the single crystal substrate. The perforated part constitutes a portion for removing the emitted light to the outside.

In the Group-III nitride semiconductor light-emitting diode of the present invention, the intermediate layer constituting the bottom surface of the perforated part has a function of firmly supporting the light-emitting part provided on the perforated part.

Particularly, the intermediate layer, which has a surface constituting the bottom surface of the perforated part of the present invention has a crystal plane of {111} face, prevents the elements constituting the intermediate layer from diffusing and invading into the Si single crystal substrate and at the same time, more firmly supporting the light-emitting part provided in the upper part.

In the Group-III nitride semiconductor light-emitting diode of the present invention, the intermediate layer composed of phosphorus (P)-containing Group Ill-V compound semiconductor film can have excellent chemical resistance capable of preventing damage or erosion accompanying the perforation at the time of punching a perforation on the back surface of the Si single crystal substrate from reaching the light-emitting part.

In particular, the intermediate layer composed of a compositional gradient layer having a gradient in the composition of the Group-III constituent element or Group-V constituent element has a function of relaxing the lattice mismatch between the Si single crystal substrate and the upper Group-III nitride semiconductor layer to give a high-quality Group-III nitride semiconductor layer reduced in crystal defect density and at the same time, firmly supporting the Group-III nitride semiconductor layer constituting the light-emitting part.

The Group-III nitride semiconductor LED having an intermediate layer consisting of a low-temperature buffer layer and a high-temperature buffer layer can be produced, for example, by the following method. E On an n-type or p-type {111}-Si single crystal substrate used as the substrate material, an intermediate layer consisting of a low-temperature buffer layer formed at a temperature lower than the high-temperature buffer layer provided thereon, and a high-temperature buffer layer provided on the low-temperature buffer layer and formed at a temperature higher than the low-temperature buffer layer, is provided. The low-temperature buffer layer is formed by growing a boron phosphide layer mainly comprising an amorphous crystal grown at a low temperature of approximately from 250 to 550° C. by MOCVD and then growing a boron phosphide single crystal layer as a single body by MOCVD at approximately from 750 to 1,200° C. The high-temperature buffer layer provides mechanical strength and comprises a compound selected from Group III–V compound semiconductors having relatively excellent mechanical strength. For the low-temperature buffer layer, a compound layer capable of assisting growth of the high temperature buffer layer on the substrate is used.

On the intermediate layer, a light-emitting part consisting of a lower clad layer, a light-emitting layer and an upper clad layer is stacked. The lower clad layer is formed by providing an n-type or p-type Group III nitride semiconductor crystal layer capable of lattice-matching the high-temperature buffer layer, for example, a $GaN_{0.97}P_{0.03}$ crystal layer matching the BP high-temperature buffer layer, at 850 to 1,200° C. On the lower clad layer, an n-type or p-type Group-III nitride semiconductor layer is formed at a temperature lower than that used in the formation of the lower clad layer. This light-emitting layer may have a quantum well structure. The p-type or n-type Group-III nitride semiconductor layers as the upper clad layer and the lower clad layer are selected to provide different conduction systems. Thereafter, a first conduction-type electrode and a second conduction-type electrode are provided on the residual substrate after etching and on the upper clad layer, respectively, thereby completing a Group-III nitride semiconductor LED.

The perforation for forming the perforated part may be performed either after the intermediate layer is stacked on a substrate or after the intermediate layer and the light-emitting part are stacked on the substrate. The back surface of the Si substrate is preferably polished by lapping to a thickness of about 300 to 80 μm in advance of perforation, and the perforation is preferably performed by wet etching at about 10 to 30° C. using a mixed solution of hydrofluoric acid and nitric acid.

The Group-III nitride semiconductor LED having a compositional gradient buffer layer as the intermediate layer can be produced, for example, by the following method.

On an n-type or p-type {111}-Si single crystal substrate used as the substrate material, a compositional gradient buffer layer composed of boron gallium phosphide in which the boron content increases in the direction increasing layer thickness is formed using MOCVD means. During growth, the boron concentration is controlled to obtain the same lattice constant as that of the Si single crystal and at the final stage, the amount of the gallium source is reduced to obtain a lattice constant on the same level as the lower clad layer which is provided thereon. The compositional gradient buffer layer can be grown at a temperature of approximately from 600 to 1,200° C. During the growth, the temperature may be kept constant or may be changed on the way.

The lower clad layer is a p-type Group-III nitride semiconductor layer capable of lattice-matching the compositional gradient layer and is grown at about 850 to 1,200° C. by MOCVD means. The light-emitting layer subsequently formed is a p-type Group-III nitride semiconductor layer capable of lattice-matching the clad layer and this layer may have a quantum well structure. The upper clad layer is an n-type Group-III nitride semiconductor crystal layer and is formed by MOCVD means.

The first conduction-type electrode uses an aluminum or an alloy thereof and the second conduction-type electrode uses gold or an alloy thereof.

The present invention is described in greater detail below by referring to Examples, which are not intended to limit the scope of the present invention and should not be construed as doing so.

EXAMPLES

Example 1

Figure 5:
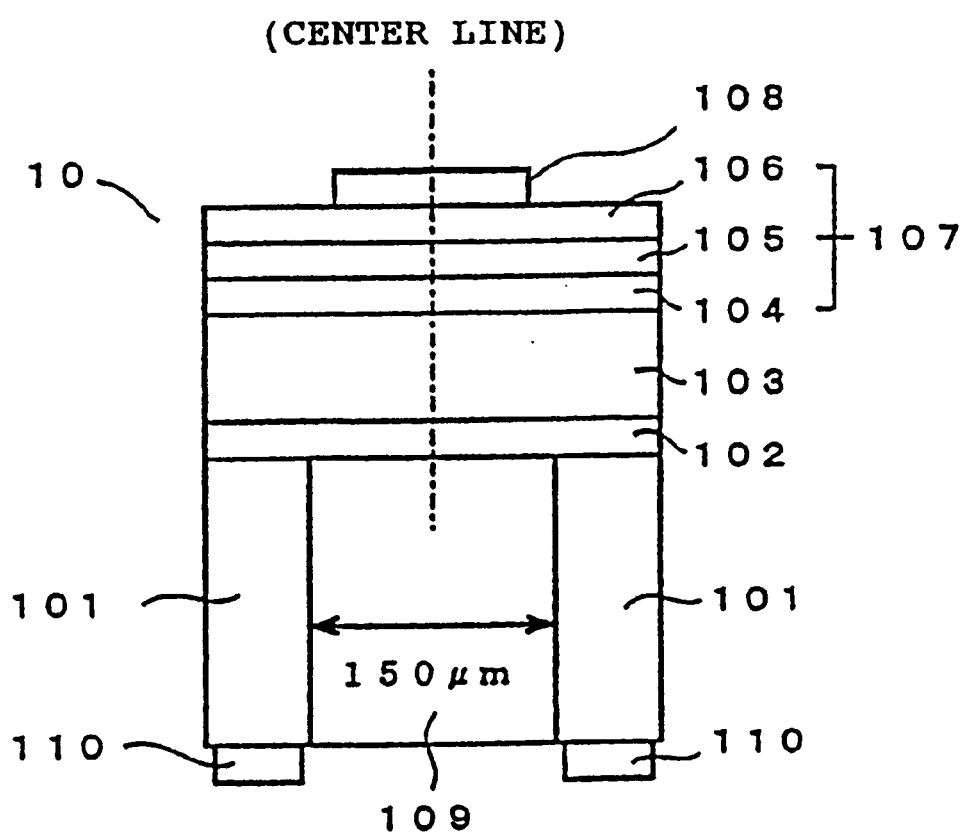
FIG. 5 is a schematic cross section view of LED described in Example 1.

The present invention is specifically described below by referring to a Group-III nitride semiconductor LED comprising an Si single crystal substrate having on the back surface thereof a circular perforated part, as an example. FIG. 5 is a view schematically showing the cross section structure of LED 10 according to this Example.

For the substrate 101, a boron (B)-doped p-type (100)-Si single crystal was used. On the substrate 101, a low-temperature buffer layer 102 composed of boron phosphide (BP) was deposited. The low-temperature buffer layer 102 was grown at 350° C. in a system of triethylboron (($C_2H_5$)$_3$B)/phosphine ($PH_3$)/hydrogen ($H_2$) by MOCVD under atmospheric pressure.

The layer thickness of the buffer layer 102 was about 14 nm. On the surface of the lower buffer layer 102, a magnesium (Mg)-doped p-type BP layer as a high-temperature buffer layer 103 was stacked at 950° C. using the above-described MOCVD vapor-phase growing means. For the magnesium doping source, biscyclopentadienyl magnesium (molecular formula: bis-($C_5H_4$)$_2$Mg) was used. The carrier concentration of the high-temperature buffer layer 103 was set to about $7 \times 10^{18}$ cm$^{-3}$ and the layer thickness was about 350 nm.

On the high-temperature buffer layer 103, a magnesium-doped p-type gallium nitride phosphide (composition formula: $GaN_{0.97}P_{0.03}$) layer having a phosphorus (P) composition ratio of 0.03 (=3%) was stacked as a lower clad layer 104. The $GaN_{0.97}P_{0.03}$ layer was grown at 950° C. in a system of trimethylgallium (($CH_3$)$_3$Ga)/$PH_3$/ammonia ($NH_3$)/$H_2$ by MOCVD under atmospheric pressure. The carrier concentration of the p-type $GaN_{0.97}P_{0.03}$ layer grown to cubic crystal was set to about $8 \times 10^{17}$ cm$^{-3}$ and the layer thickness was about 85 nm.

On the lower clad layer 104, a light-emitting layer 105 composed of an n-type gallium indium nitride (composition formula: $Ga_XIn_{1-X}N$, wherein $0<X\leq1$) was stacked. The silicon (Si)-doped $Ga_XIn_{1-X}N$ layer constituting the light-emitting layer 105 was grown at 850° C. in a system of ($CH_3$)$_3$Ga/trimethylindium (($CH_3$)$_3$In)/disilane ($Si_2H_6$)/$NH_3$/$H_2$ by MOCVD under atmospheric pressure. The average indium (In) composition ratio of the light-emitting layer 105 was 0.10. The layer thickness of the light-emitting layer 105 was about 80 nm and the carrier concentration was set to about $3 \times 10^{18}$ cm$^{-3}$.

On the $Ga_{0.90}In_{0.10}N$ light-emitting layer 105, a silicon (Si)-doped n-type aluminum gallium nitride ($Al_YGa_{1-Y}N$) layer having a gradient in the aluminum (Al) composition was stacked as a upper clad layer 106. The Al composition ratio (=γ) was gradually and almost linearly reduced from 0.2 to 0 (zero) in the direction of increasing layer thickness. The layer thickness was 200 nm.

The light-emitting part 107 having a pn-double heterojunction structure was constructed by those p-type $GaN_{0.97}P_{0.03}$ lower clad layer 104, n-type $Ga_{0.90}In_{0.10}N$ light-emitting layer 105 and upper clad layer 106 composed of n-type $Al_YGa_{1-Y}N$ compositional gradient layer.

Figure 6:
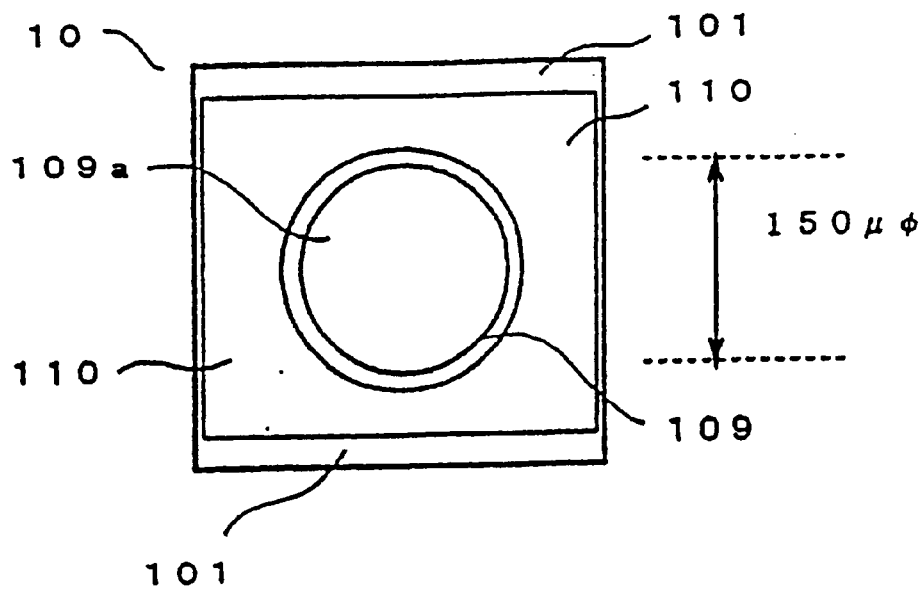
FIG. 6 is a schematic view showing the structure on the back surface of LED described in Example 1.

Using known photolithography technique and selective etching technique, as shown in FIG. 6, the center part on the back surface of the p-type Si single crystal substrate 101 was perforated into a hollow cylindrical form having a bottom surface diameter of about 150 μm. The perforated part 109 was formed by etching and thereby eliminating the Si single crystal using a mixed solution of hydrofluoric acid (HF) and nitric acid ($HNO_3$). The depth of the perforated part 109 was set to about 300 μm corresponding to the layer thickness of the substrate 101. The etching was allowed to proceed until the BP low-temperature buffer layer 102 was exposed on the bottom surface 109a of the perforated part 109. On the Si single crystal substrate 101 remaining in the circumference of the perforated part 109, a p-type ohmic electrode 110 composed of gold (Au) coating was disposed. In the center on the surface of the upper clad layer 106, a circular ohmic electrode 108 composed of gold (Au) was disposed. The diameter of the n-type ohmic electrode 108 was about 130 μm. The center on the circular bottom surface 109a of the perforated part 109 and the center on the horizontal form of the surface ohmic electrode were adjusted to coincide.

An LED driving current was passed between two ohmic electrodes 108 and 110. The current-voltage (I–V characteristics) exhibited normal rectification characteristics based on good pn-junction properties of the light-emitting part 107. The forward voltage (so-called Vf) determined from the I–V characteristics was about 3 V (forward current: 20 mA). The reverse voltage was about 15 V (reverse current: 10 μA). When an operating current of 20 milliampere (mA) was passed in the forward direction, blue light having an emission center wavelength at about 470 nm was emitted. The half width of the light emission spectrum was about 18 nm. The light emission intensity in the chip state measured using a general integrating sphere was about 18 microwatt (μW). Thus, a Group-III nitride semiconductor light-emitting device having high light emission intensity was provided.

Example 2

Figure 7:
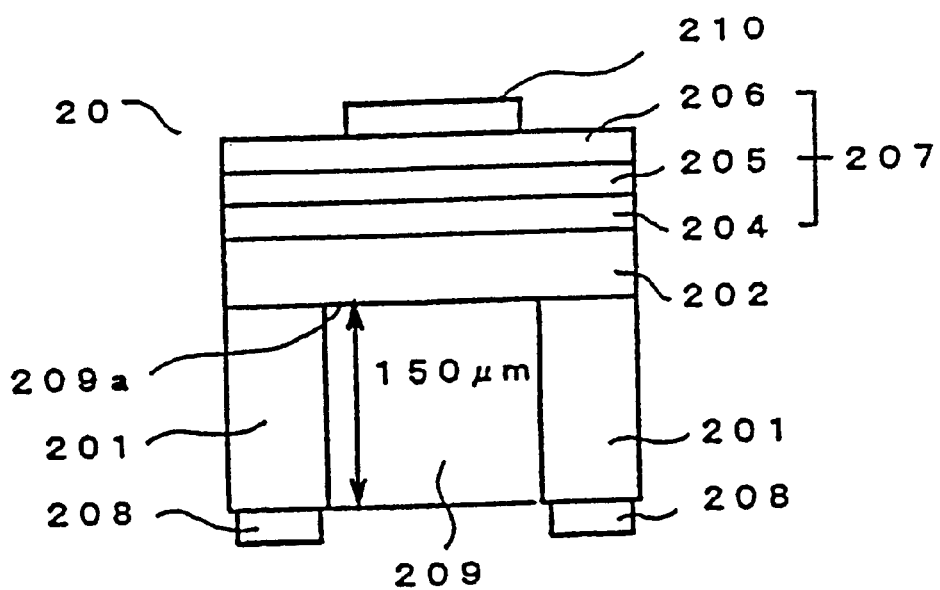
FIG. 7 is a schematic cross section view of LED described in Example 2.

FIG. 7 is a view schematically showing the laminate structure of this Example. On a phosphorus (P)-doped n-type {111}-Si single crystal substrate 201, a buffer layer 202 composed of a boron gallium phosphide (composition formula: $B_XGa_{1-X}P$) compositional gradient layer increased in the boron (B) composition ratio (=X) in the direction of increasing layer thickness was stacked at 650° C. in a system of diborane (molecular formula: ($B_2H_6$)/($CH_3$)$_3$Ga/$PH_3$/$H_2$) by MOCVD under reduced pressure. The pressure in the reaction system during the growing was set to about $1.3 \times 10^4$ Pascal (unit: Pa). The layer thickness of the buffer layer 202 was 0.8 μm. The boron (B) composition ratio (=X) of the $B_XGa_{1-X}P$ compositional gradient layer 202 at the junction surface with the Si single crystal 201 was set to 0.02 so that the same lattice constant (=5.431 Å) as the Si single crystal could be obtained. The boron composition ratio on the surface was set to 1.0 to obtain the same lattice constant (=4.538 Å) as the $GaN_{0.97}P_{0.03}$ lower clad layer provided thereon. The boron composition ratio (=X) was linearly increased in the direction of increasing layer thickness of the buffer layer 202. The boron composition ratio was changed by increasing the amount of diborane as the boron source supplied to the MOCVD reaction system with the passage of time and decreasing the amount of trimethylgallium ((CH$_3$)$_3$Ga) supplied as the gallium (Ga) source. During growth of the B$_X$Ga$_{1-X}$P compositional gradient layer 202, silicone was doped using a disilane (Si$_2$H$_6$)-H$_2$ mixed gas.

On the B$_X$Ga$_{1-X}$P compositional gradient buffer layer 202, a silicon (Si)doped n-type gallium nitride phosphide (GaN$_{0.97}$P$_{0.03}$) layer having a phosphorus (P) composition ratio of 0.03 (=3%) was stacked as a lower clad layer 204. The GaN$_{0.97}$P$_{0.03}$ layer was grown at 950° C. in a system of trimethylgallium (molecular formula: (CH$_3$)$_3$Ga)/PH$_3$/NH$_3$/H$_2$) by MOCVD under atmospheric pressure. The carrier concentration of the cubic n-type GaN$_{0.97}$P$_{0.03}$ layer was set to about 8×10$^{17}$ cm$^{-3}$ and the layer thickness was about 85 nm.

On the lower clad layer 204, a light-emitting layer 205 composed of n-type gallium indium nitride (composition formula: Ga$_X$In$_{1-X}$N, wherein 0<X≦1) was stacked. The silicon (Si)-doped Ga$_X$In$_{1-X}$N layer constituting the light-emitting layer 205 was grown at 850° C. in a system of (CH$_3$)$_3$Ga/(CH$_3$)$_3$In/Si$_2$H$_6$/NH$_3$/H$_2$ by MOCVD under atmospheric pressure. The average indium (In) composition ratio of the light-emitting layer 205 was 0.10. The layer thickness of the light-emitting layer 205 was about 80 nm and the carrier concentration was set to about 3×10$^{18}$ cm$^{-3}$.

On the Ga$_{0.97}$In$_{0.10}$N light-emitting layer 205, a p-type gallium nitride mixed crystal (GaN) layer doped with both zinc (Zn) and magnesium (Mg) was stacked as the upper clad layer 206.

The light-emitting part 207 having a pn-double heterojunction structure was constructed by those n-type GaN$_{0.97}$P$_{0.03}$ lower clad layer 204, n-type Ga$_{0.90}$In$_{0.10}$N light-emitting layer 205 and upper clad layer 206 composed of p-type GaN layer.

Figure 8:
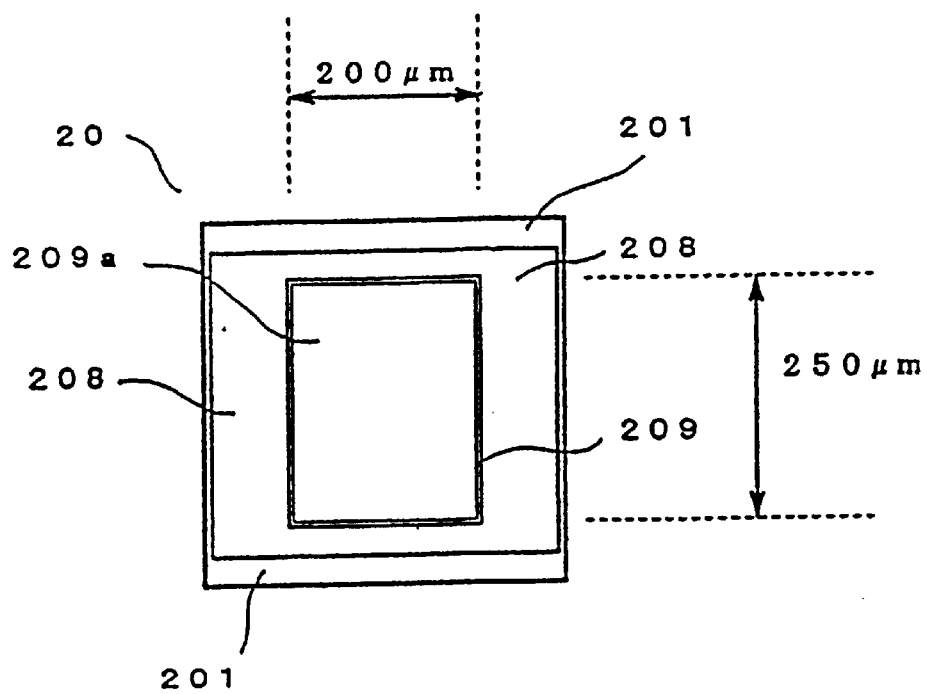
FIG. 8 is a schematic view showing the structure on the back surface of LED described in Example 2.

Thereafter, the back surface of the {111}-Si single crystal substrate 201 was polished to reduce the substrate thickness from about 350 μm to about 150 μm. Then, using a known photolithography technique and selective etching technique, as shown in FIG. 8, a perforated part 209 in the rectangular form was provided in the center part on the back surface of the n-type Si single crystal substrate 201. The length of the short side of the perforated part 209 was 200 μm and the length of the long side was 250 μm. The perforated part 209 was formed by eliminating the Si single crystal 201 utilizing plasma etching means using a chlorine-base gas. The depth of the perforated part 209 from the back surface of the substrate 201 was about 150 μm. On the bottom surface 209a of the perforated part 209, the surface of the {111}-B$_X$Ga$_{1-X}$P buffer layer 202 obtained by using an Si single crystal having a crystal plane of {111} as the substrate 202 was exposed. On the Si single crystal remaining to surround the perforated part 209, an n-type ohmic electrode 208 composed of gold (Au) was disposed.

Almost on the entire surface of the upper clad layer 206, a p-type ohmic electrode 210 composed of a thick film having a multilayer structure of gold (Au) and nickel oxide (NiO) was formed. The thickness of the gold coating was about 2 μm and the thickness of nickel oxide was about 0.5 μm.

The p-type ohmic electrode 210 side of the thus-fabricated LED 20 was electrically connected and bonded to a support and then, the intensity of light emitted to the outside through the perforated part 209 was measured. The emission intensity measured in this mounted state using a general integrating sphere was about 16 microwatt (μW). Thus, a Group-III nitride semiconductor light-emitting device having high light emission intensity was provided. The center wavelength of the light emission was about 470 nm and the half width of the light emission spectrum was about 20 nm. The forward voltage (Vf) was about 3 V (forward current: 20 mA) and the reverse voltage was about 15 V (reverse current: 10 μA).

According to the present invention, a Group-III nitride semiconductor light-emitting diode is provided, comprising an electrically conducting silicon (Si) single crystal substrate having on the surface thereof at least a light-emitting part having a pn-heterojunction structure composed of a Group-III nitride semiconductor, which is stacked through an intermediate layer composed of a metal or a semiconductor, the single crystal substrate having a back surface electrode on the back surface thereof and a surface electrode on the light-emitting part in the surface side, wherein a perforated part formed by partially eliminating the single crystal substrate is provided on the back surface of the single crystal substrate and an ohmic electrode is disposed on the electrically conducting Si single crystal substrate remaining in the circumference of the perforated part, thereby fabricating LED. By virtue of this structure, the emitted light of LED can be withdrawn through the perforated part to the outside while completely or greatly reducing the absorption of emitted light attributable to the Si single crystal substrate and without losing the mechanical strength of the LED. Thus, a Group-III-nitride semiconductor LED having excellent light emission intensity can be provided.

Furthermore, when the Si single crystal is eliminated without fail to expose the crystal surface of the intermediate layer serving as the bottom surface of the perforated part, the emitted light can be withdrawn while completely avoiding the absorption of emitted light in the perforated part attributable to the Si single crystal and thereby not causing reduction in the light emission intensity, so that a Group-III-nitride semiconductor LED having excellent light emission intensity can be provided.

When the Si single crystal in the perforated part is eliminated without fail and the {111} crystal plane of the intermediate layer is exposed on the bottom surface, the absorption of emitted light attributable to the Si single crystal can be eliminated and at the same time, the reduction in the supporting power of the light-emitting part due to the elimination of the Si single crystal substrate can be supplemented, so that a substrate elimination-type Group-III-nitride semiconductor LED comprising firmly supported light-emitting part can be provided.

In particular, when the intermediate layer is composed of a Group III–V compound semiconductor film containing phosphorus (P), as compared with Group III–V semiconductors comprising arsenic as a constituent element, a Group-III nitride semiconductor LED comprising an intermediate layer ensuring high mechanical strength and because of its extremely high melting point, capable of firmly supporting the light-emitting part and exhibiting excellent heat resistance, can be fabricated.

Furthermore, when the intermediate layer is constructed as a compositional gradient layer having a gradient in the composition of the Group-III constituent element or Group-V constituent element, the formed intermediate layer can have lattice matching with both the Si single crystal and the Group-III nitride semiconductor layer as an upper layer thereof, so that the crystal defect density ascribable to the lattice mismatching at the interface with the light-emitting layer can be reduced, a Group-III nitride semiconductor layer having good crystallinity can be obtained and a Group-III nitride semiconductor LED having high light emission intensity can be provided.

While the invention has been described in detail and with reference to specific embodiments thereof, it will be apparent to one skilled in the art that various changes and modifications can be made therein without departing from the spirit and scope thereof.

This application is based on Japanese Patent Application No. P2001-43142 filed Feb. 20, 2001, and on U.S. Provisional Application No. 60/276,206 filed Mar. 16, 2001, the disclosures of which are incorporated herein by reference in their entirety.

What is claimed is:

1. A Group-III nitride semiconductor light-emitting diode comprising an electrically conducting silicon single crystal substrate having on an upper surface thereof at least a light-emitting part having a pn-heterojunction structure composed of a Group-III nitride semiconductor, which light-emitting part is stacked via an intermediate layer composed of a semiconductor, the single crystal substrate having a back surface electrode on a back surface thereof, a surface electrode on an upper surface of the light-emitting part and a perforated part formed by eliminating the Si single crystal substrate in a region exclusive of the back surface electrode on the back surface of the single crystal substrate, wherein the intermediate layer is exposed at the bottom surface of the perforated part, the intermediate layer comprises $B_xM_{1-x}P$ wherein M represents a Group-III element other than boron, and X is in the range of $0<X\leq 1$ and the intermediate layer has a compositional gradient of a Group-III constituent element to obtain the same lattice constant as the Si single crystal at the junction surface with the Si single crystal and as a lower clad layer at the junction surface with the lower clad layer.

2. The Group-III nitride semiconductor light-emitting diode as claimed in claim 1, wherein the back surface electrode on the silicon single crystal substrate comprises a continuous metal coating electrode.

3. The Group-III nitride semiconductor light-emitting diode as claimed in claim 1, wherein the back surface electrode on the silicon single crystal substrate comprises a continuous metal coating electrode in an outer circumference of the perforated part.

4. A method for manufacturing a Group-III nitride semiconductor light-emitting diode, comprising an electrically conducting silicon single crystal substrate having on an upper surface thereof at least a light-emitting part having a pn-heterojunction structure composed of a Group-III nitride semiconductor, which light-emitting part is stacked via an intermediate layer composed of a semiconductor, the single crystal substrate having a back surface electrode on a back surface thereof, a surface electrode on an upper surface of the light-emitting part and a perforated part in a region exclusive of the back surface electrode on the back surface of the single crystal substrate, wherein the intermediate layer is exposed at the bottom surface of the perforated part, the intermediate layer comprises $B_xM_{1-x}P$ wherein M represents a Group-III element other than boron, and X is in the range of $0<X\leq 1$, and the intermediate layer has a compositional gradient of a Group-III constituent element to obtain the same lattice constant as the Si single crystal at the junction surface with the Si single crystal and as a lower clad layer at the junction surface with the lower clad layer, which comprises providing the intermediate layer having a low-temperature buffer layer and a high-temperature buffer layer on the electrically conducting silicon single crystal substrate, providing the light-emitting part having a pn-heterojunction structure and including the lower clad layer, a light-emitting layer and an upper clad layer on the intermediate layer, perforating the back surface of the silicon single crystal substrate into a hollow cylindrical form to obtain the perforated part, and providing a first conduction-type electrode on the remaining back surface of the silicon single crystal substrate and a second conduction-type electrode on the upper surface of the upper clad layer.

5. The method for manufacturing a Group-III nitride semiconductor light-emitting diode as claimed in claim 4, which comprises growing the low-temperature layer at 250 to 550° C. by MOCVD and the high-temperature layer at 750 to 1,200° C. by MOCVD.

6. A method for manufacturing a Group-III nitride semiconductor light-emitting diode, comprising an electrically conducting silicon single crystal substrate having on an upper surface thereof at least a light-emitting part having a pn-heterojunction structure composed of a Group-III nitride semiconductor, which light-emitting part is stacked via an intermediate layer composed of a semiconductor, the single crystal substrate having a back surface electrode on a back surface thereof, a surface electrode on an upper surface of the light-emitting part and a perforated part in a region exclusive of the back surface electrode on the back surface of the single crystal substrate, wherein the intermediate layer is exposed at the bottom surface of the perforated part, the intermediate layer comprises $B_xM_{1-x}P$ wherein M represents a Group-III element other than boron, and X is in the range of $0<X\leq 1$, and the intermediate layer has a compositional gradient of a Group-III constituent element to obtain the same lattice constant as the Si single crystal at the junction surface with the Si single crystal and as a lower clad layer at the junction surface with the lower clad layer, which comprises providing intermediate layer consisting of a compositional gradient buffer layer on the electrically conducting silicon single crystal substrate, providing the light-emitting part having a pn-heterojunction structure and including the lower clad layer, a light-emitting layer and an upper clad layer on the intermediate layer, perforating the back surface of the silicon single crystal substrate into a hollow cylindrical form to obtain the perforated part, and providing a first conduction-type electrode on the remaining back surface of the silicon single crystal substrate and a second conduction-type electrode on the upper surface of the upper clad layer.

7. The method for manufacturing a Group-III nitride semiconductor light-emitting diode as claimed in claim 4, wherein the crystal plane of the electrical conducting Si single crystal substrate is {111}.

8. The method for manufacturing a Group-III nitride semiconductor light-emitting diode as claimed in claim 6, wherein the crystal plane of the electrical conducting Si single crystal substrate is {111}.

9. The method for manufacturing a Group-III nitride semiconductor light-emitting diode as claimed claim 4, which further comprises grinding the back surface of the silicon single crystal substrate to reduce the thickness of the substrate to 300 to 80 μm and eliminating the single crystal substrate in the part excluding the region where an ohmic electrode is laid to provide the perforated part after providing the intermediate layer on the surface of the silicon single crystal substrate.

10. The method for manufacturing a Group-III nitride semiconductor light-emitting diode as claimed claim 6, which further comprises grinding the back surface of the silicon single crystal substrate to reduce the thickness of the substrate to 300 to 80 μm and eliminating the single crystal substrate in the part excluding the region where an ohmic electrode is laid to provide the perforated part after providing the intermediate layer on the surface of the silicon single crystal substrate.

* * * * *